United States Patent
Leyda et al.

(10) Patent No.: US 6,797,879 B2
(45) Date of Patent: Sep. 28, 2004

(54) AVIONICS TRAY ASSEMBLY AND SEAL ASSEMBLY

(75) Inventors: John G. Leyda, Lake Stevens, WA (US); Stephen M. Edwards, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/247,056

(22) Filed: Sep. 17, 2002

(65) Prior Publication Data

US 2004/0050569 A1 Mar. 18, 2004

(51) Int. Cl.⁷ .............................................. H02G 3/08
(52) U.S. Cl. ................ 174/50; 174/17 CT; 174/17 VA; 174/153 G; 361/694
(58) Field of Search ...................... 174/50, 52.1, 17 CT, 174/17 VA, 48, 153 G; 361/694, 683, 684, 690, 691; 277/645, 642, 640; 211/126.1, 134; 248/27.1, 634; 454/184; 244/1 R (56) References Cited

U.S. PATENT DOCUMENTS

| | | | |
|---|---|---|---|
| 3,771,023 A | * 11/1973 | Hollingsead et al. | ....... 277/645 |
| 3,871,937 A | * 3/1975 | Hollingsead et al. | ... 174/153 G |
| 4,044,515 A | * 8/1977 | Hollingsead et al. | ....... 277/645 |
| 4,458,296 A | 7/1984 | Bryant et al. | |
| 4,687,127 A | * 8/1987 | Pardo et al. | ................. 277/645 |
| 4,766,517 A | * 8/1988 | Abell | ......................... 361/691 |
| 4,888,664 A | * 12/1989 | Rojc | ...................... 174/153 G |
| 5,129,594 A | * 7/1992 | Pease | ......................... 174/52.1 |
| 5,170,320 A | * 12/1992 | Pease | ......................... 361/690 |
| 5,190,241 A | * 3/1993 | Pease | ......................... 174/52.1 |
| 5,400,217 A | * 3/1995 | Whitson et al. | ............ 454/184 |
| 5,464,461 A | * 11/1995 | Whitson et al. | .............. 55/480 |

* cited by examiner

Primary Examiner—Dean A. Reichard
Assistant Examiner—Angel R. Estrada
(74) Attorney, Agent, or Firm—Shimokaji & Associates, P.C.

(57) ABSTRACT

The present invention provides an avionics tray assembly that includes a seal assembly and a tray detail. The seal assembly includes a metering plate detail, a plurality of tabs disposed along the metering plate detail, a plurality of location bosses disposed along the metering plate detail, and a flange extending from the metering plate detail, while the tray detail includes a plurality of index bosses and a horizontal surface, wherein the plurality of index bosses receive the plurality of location bosses, wherein the plurality of tabs secure the seal assembly to the tray detail, and wherein the flange secures the seal assembly to the horizontal surface.

16 Claims, 9 Drawing Sheets

AVIONICS TRAY ASSEMBLY AND SEAL ASSEMBLY

BACKGROUND OF THE INVENTION

The present invention generally relates to avionic equipment and, more specifically, to an enhanced avionics tray assembly and seal assembly.

An avionic tray assembly provides support and self-indexing for rack mounted equipment, commonly known as line replaceable units (LRUs). Each LRU contains internal electrical components that are connected to the avionic tray assembly with a rack and panel connector and mechanical fasteners, commonly known as hold-downs. The rack and panel connector, located at the rear of the avionic tray assembly, provides the electrical connection to aircraft systems and structural support for the LRU. The hold-downs, located at the front of the avionic tray assembly, secure the LRU into the avionics tray assembly and apply horizontal force to engage the rack and panel connector. The avionic tray assembly also provides a cooling interface for the internal electrical components of the LRU. The cooling interface may be accomplished with a seal assembly that is part of the overall avionic tray assembly. The seal assembly is attached on the lower horizontal surface of the avionic tray assembly and contacts the lower surface of the LRU when it is fully installed. The hold-downs also provide a downward force that will compress the seal assembly against the LRU to complete the cooling interface.

The avionic tray assembly includes mounting provisions for an LRU, electrical wire bundle(s), and a cooling interface that can be adjusted to specific thermal requirements for each piece of equipment. The avionic tray assembly varies in width accommodating the specific size of each LRU based on standard increments, commonly known as Austin Trumbull Radio Racking System (ATR) or Modular Concept Unit (MCU). The LRU specifications for ATR and MCU, defined by Aeronautical Radio Incorporated (ARINC) 404A or ARINC 600, are industry standards for rack mounted aircraft avionic equipment. The term rack mounted equipment refers to LRUs that are installed on an avionic tray assembly, which are further attached to an assembly known as a shelf assembly. The shelf assembly may further be attached to a support structure known as a rack.

Typically, when an LRU is being Installed, it rotates around a horizontal axis, influenced by the orientation of the rack and panel connector. When the LRU rotates, it could contact an outside horizontal surface of the avionic tray assembly. If such contact occurs, the force required for engaging or disengaging the LRU from the rack and panel connector would increase. Since the hold-downs are force-limiting devices, the amount of horizontal force applied could be inadequate to fully mate or engage the LRU to the rack and panel connector. As such, the electrical contacts internal to the rack and panel connector may not be mated properly thus causing a loss of signal. If this occurs, the electrical circuit would be incomplete and the LRU would require removal and re-installation (known as re-racking) In order to function properly.

During maintenance activities, LRUs may be removed and unintentional pressure may be applied to the seal assembly in a downward direction. Such pressure can dislodge the seal assembly from the tray assembly. As such, the shelf assembly would need to be disassembled, reassembled and pressure tested prior to the airplane being returned to revenue service.

A conventional tray assembly, described, for example, in U.S. Pat. No. 4,458,296 and assigned to the assignee of the present invention, has several manufacturing concerns associated with its assembly process. For example, to install the seal assembly, an extruded seal may be press fit into location by deforming the extruded seal then smoothing it back to its original shape. The seal assembly can be installed Into the tray assembly with a sealant between the extruded seal and the tray detail. Additional sealant may then be applied on the periphery of the extruded seal to complete the installation process. The existing seal assembly has adhesion problems between the silicon extruded seal and the metering plate, and between the seal assembly and the tray detail.

A conventional seal assembly, also described, for example, in U.S. Pat. No. 4,458,296, may be fabricated from different materials. The metering plate detail can be formed using a semi-rigid-plastic while the extruded seal may be fabricated from an extruded silicon material before being cut to length. The extruded seal can be attached to a metering plate detail using an adhesive. Since the metering plate detail and the extruded seal are usually manufactured with different materials, the adhesion of the adhesive is less than satisfactory, typically resulting in rework prior to installation in the tray assembly.

Other limitations include an internal bend radius of the tray detail being lower than design standards specify. In such a scenario, a dye penetrate inspection is typically performed to insure part quality. Dye penetrate can highlight flaws and cracks In the tray assembly that are too small to see by normal visual inspection. Such inspections are costly and time consuming As can be seen, there is a need for an improved tray assembly that improves LRU alignment and engagement characteristics, reduces the manual effort required during tray assembly, indexes the seal assembly to the tray assembly, increases the depth of the recessed area of the tray detail that receives the seal assembly, includes a plurality of metering plate detail index bosses, and increases the internal radius of the tray assembly.

SUMMARY OF THE INVENTION

In one aspect of the present invention, an avionics tray assembly comprises a seal assembly and a tray detail. The seal assembly comprises a metering plate detail, a plurality of tabs disposed along the metering plate detail, a plurality of location bosses disposed along the metering plate detail and, a flange extending from the metering plate detail, while the tray detail comprises a plurality of index bosses and a horizontal surface, wherein the plurality of index bosses receive the plurality of location bosses, wherein the plurality of tabs secure the seal assembly to the tray detail, and wherein the flange secures the seal assembly to the horizontal surface.

In another aspect of the present invention, an avionics tray assembly comprises a seal assembly and a tray detail. The seal assembly comprises a metering plate detail, a plurality of tabs disposed along the metering plate detail, a plurality of location bosses disposed along the metering plate detail, a flange extending from the metering plate detail, a top portion, an upper seal coupled to the top portion, a bottom portion, and a lower seal coupled to the bottom portion, while the tray detail comprises a plurality of index bosses, horizontal surface, at least one vertical surface, a recessed area, and an internal radius, wherein the internal radius supports an area of transition between the horizontal surface and the at least one vertical surface, wherein the recessed area further comprises a cutout; wherein the cutout receives the seal assembly, wherein the plurality of index bosses receive the plurality of location bosses, wherein the plurality of tabs secure the seal assembly to the tray detail, and wherein the flange secures the seal assembly to the horizontal surface.

In a further aspect of the present invention, a seal assembly comprises a metering plate detail, a plurality of tabs disposed along the metering plate detail, a plurality of location bosses disposed along the metering plate detail, a flange extending from the metering plate detail, and punch-out portions disposed along the metering plate detail, wherein aperture openings are formed through the metering plate detail in a location of the punch-out portions if the punch-out portions are removed.

In yet another aspect of the present invention, a seal assembly comprises a metering plate detail, a plurality of tabs disposed along the metering plate detail, a plurality of location bosses disposed along the metering plate detail, and a flange extending about 0.40 inches from the metering plate detail.

In yet a further aspect of the present invention, a seal assembly comprises a metering plate detail, a plurality of tabs disposed along the metering plate detail, a plurality of location bosses disposed along the metering plate detail, a flange extending from the metering plate detail, a top portion, an upper seal coupled to the top portion, a bottom portion, and a lower seal coupled to the bottom portion.

In yet a further aspect of the present invention, a method for producing a seal assembly comprises forming a metering plate detail, forming at least one tab on the metering plate detail, forming at least one index boss on the metering plate detail, forming at least one flange on the metering plate detail, forming a top portion, forming a bottom portion, forming at least one seal on the top portion, and forming at least one seal on the bottom portion.

In yet another aspect of the present invention, a tray detail comprises a horizontal surface, at least one vertical surface, a recessed area sunk to a minimum depth of about 0.05 inches, and an internal radius of about 0.07 inches supporting an area of transition between the horizontal surface and the at least one vertical surface.

In yet a further aspect of the present invention, a tray detail comprises a horizontal surface, two vertical surfaces, a recessed area disposed along the horizontal surface, the recessed area comprising a cutout, an index boss disposed along the cutout, and an internal radius supporting an area of transition between the horizontal surface and the two vertical surfaces.

In yet another aspect of the present invention, a method for producing a tray assembly comprises forming a horizontal surface, forming a plurality of vertical surfaces, forming a recessed area to a minimum depth of about 0.05 inches in a portion of the horizontal surface, forming a cutout through a portion of the recessed area, and forming an internal radius of about 0.07 inches along an area of transition between the horizontal surface and the vertical surfaces.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides an improved avionic tray assembly and seal assembly (or metering plate) that enhance an LRU installation process by reducing the effect of the tray detail on the rack and panel connector engagement. The installation and removal of the LRU can be assisted by the elimination of the contact (friction) with the tray detail until after the rack and panel connector is nearly fully engaged. The seal assembly supports the LRU (unlike the prior art where the LRU is supported by the horizontal surface of the tray detail during the installation process). With the LRU supported by the seal assembly, the LRU can align with the rack and panel connector without misalignment and additional binding or friction related to the tray surface.

After the rack and panel connector contacts have achieved minimum engagement, the LRU will contact the tray detail next to a back plate for approximately an additional 0.06 inches to complete the mating of the full rack and panel connector. The LRU disengagement is enhanced for the same reasons as the insertion of the LRU. This will reduce the tendency for the LRU to lift from the tray causing binding of the rack and panel connector. The design of the seal assembly incorporates a seal that will contact (compress) to the bottom surface of the LRU resulting in an interface seal with the tray assembly. The downward force of the hold-downs accomplishes such seal compression.

Figure 1:
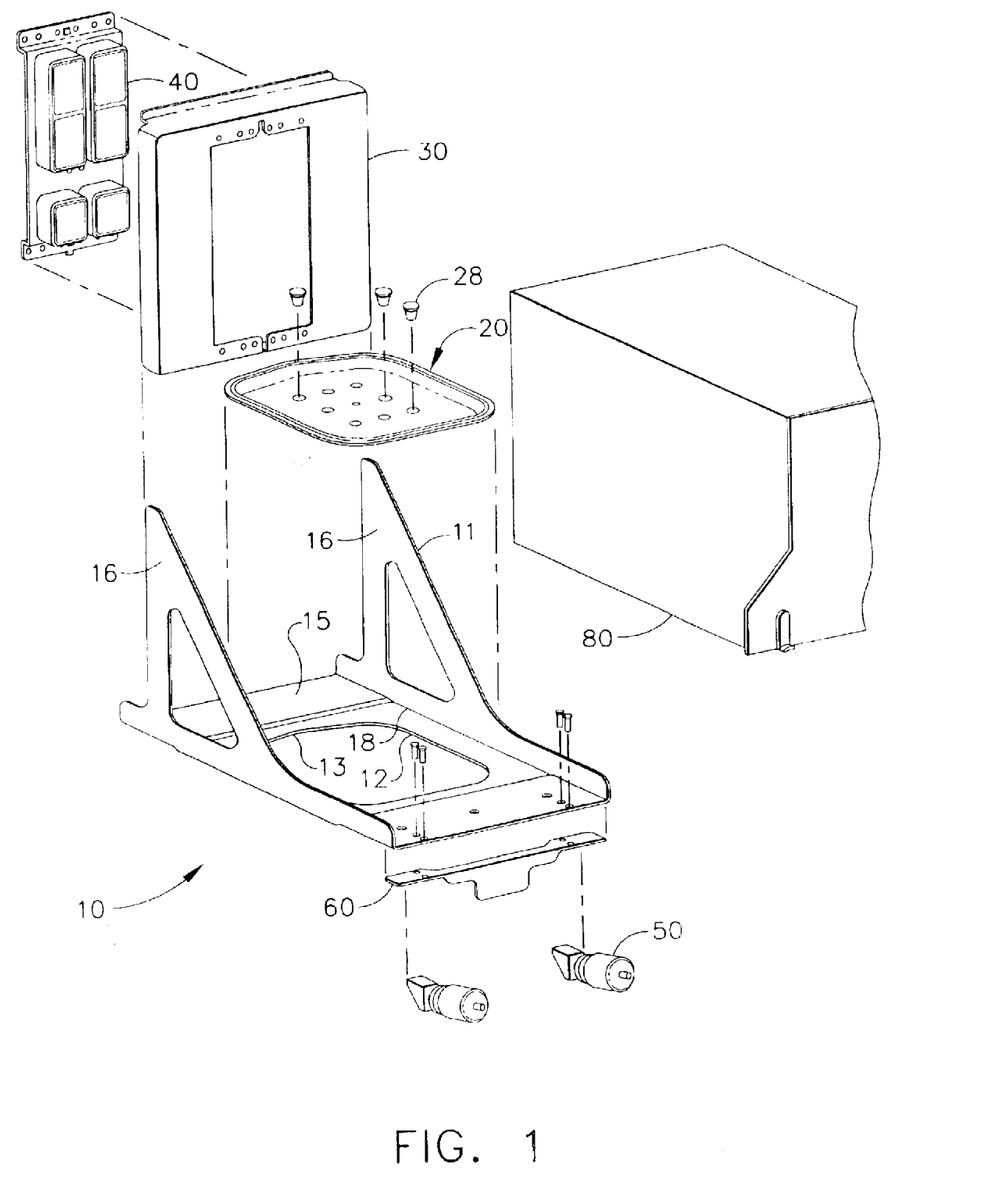
FIG. 1 is an isometric view of an avionic tray assembly, a seal assembly, and an LRU in accordance with the present invention.

Referring now to FIG. 1, a tray assembly 10 of the present invention, a seal assembly 20 of the present invention, a back plate 30, a rack and panel connector 40, and an LRU 80 are shown. The tray assembly 10 comprises a tray detail 11, a cutout 12, an index boss 13, an internal radius 18, a horizontal surface 15 and vertical surfaces 16, while the seal assembly 20 may comprise cooling adjustment plugs 28. Other elements of the tray assembly 10 and the seal assembly 20 will be described below. An LRU 80 can be connected to a rack and panel connector 40 which can be positioned within a back plate 30. Hold-downs 50, connected to a stiffener 60, may further secure the LRU to the tray assembly 10.

Figure 2:
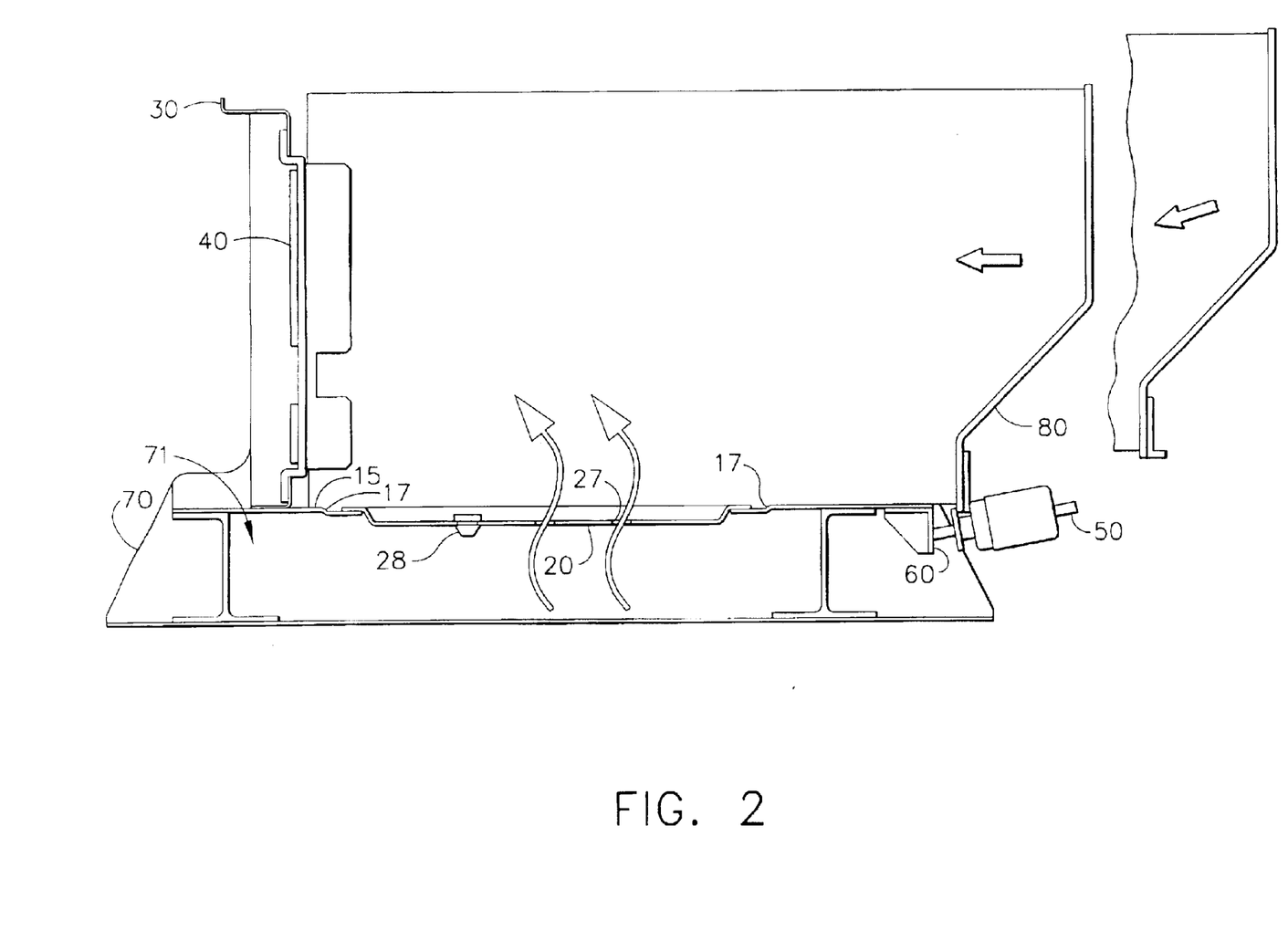
FIG. 2 is a side view of the tray assembly, the seal assembly, and the LRU in accordance with the present invention.
Figure 6A:
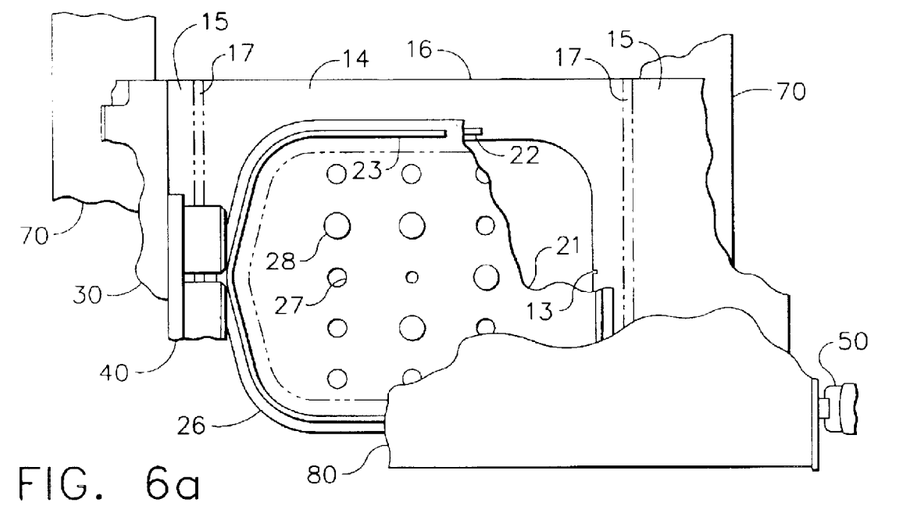
FIG. 6a is a plan view of the seal assembly and a tray detail depicting location bosses, attachment tabs, a metering plate detail, seals, and a flange in accordance with the present invention.
Figure 6B:
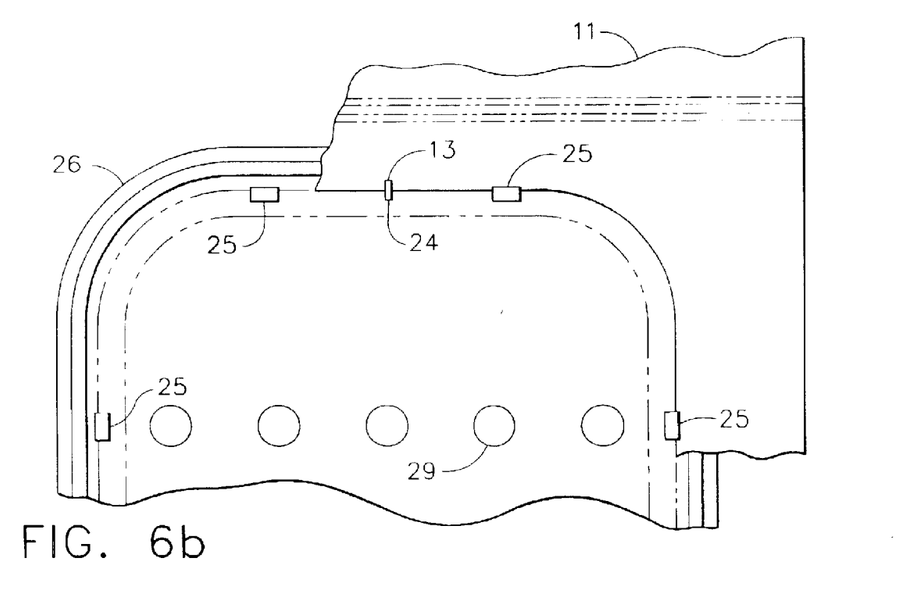
FIG. 6b is the bottom view of FIG. 6a rotated 90 degrees in accordance with the present invention.
Figure 7A:
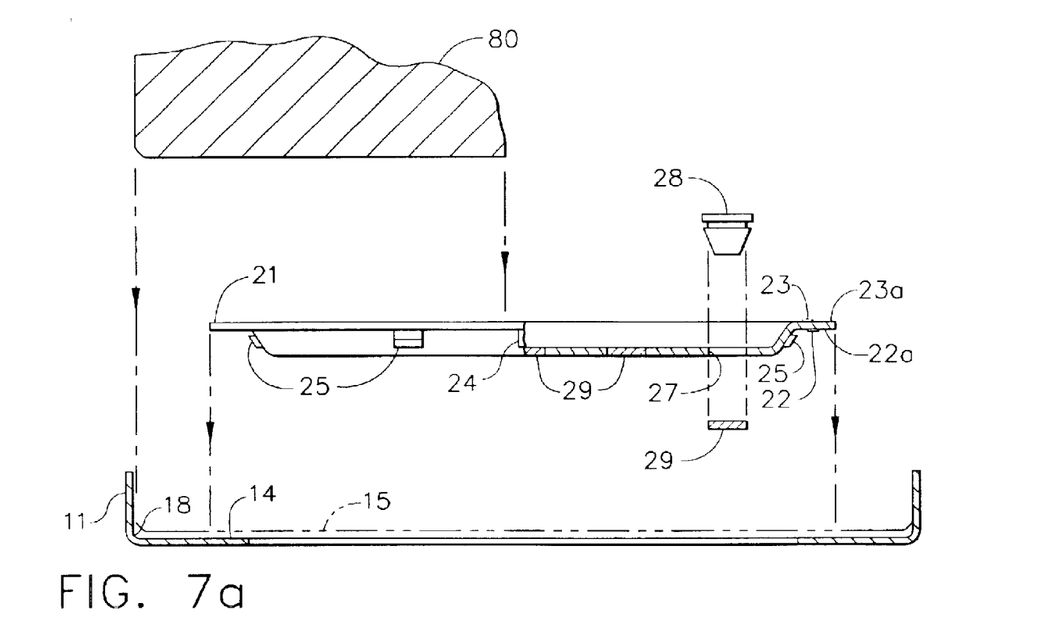
FIG. 7a is a front view of the tray assembly, the seal assembly, and the LRU in accordance with the present invention.
Figure 7B:
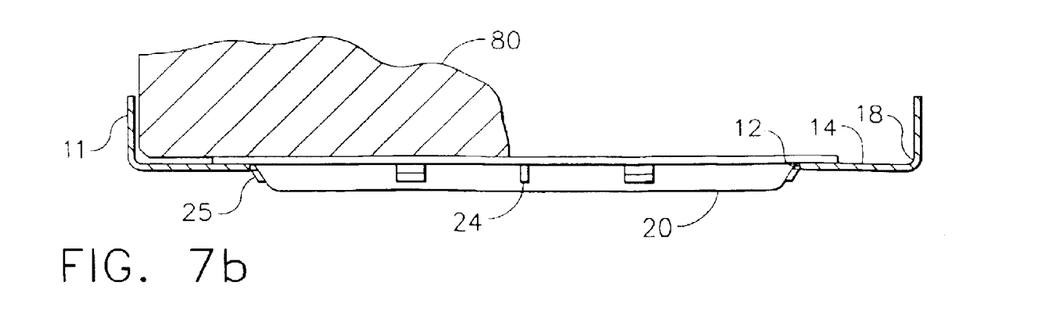
FIG. 7b is a front view of the tray assembly, the seal assembly, and the LRU connected to one another in accordance with the present invention.

Referring now to FIG. 2, the LRU 80 is shown connected to the rack and panel connector 40 that is positioned within the back plate 30. Aperture openings 27 in the seal assembly 20 receive cold air from a plenum (not shown) in a shelf assembly 70. The cooling adjustment plugs 28 can be positioned within various aperture openings 27 to control an amount of cold air the LRU 80 receives. The aperture openings 27 are formed from punch-out portions 29 (depicted in FIG. 6b) pertaining to certain LRU 80 cooling configurations. The tray assembly 10 includes the horizontal surface 15 and transition areas 17 that will be described further below.

Figure 3:
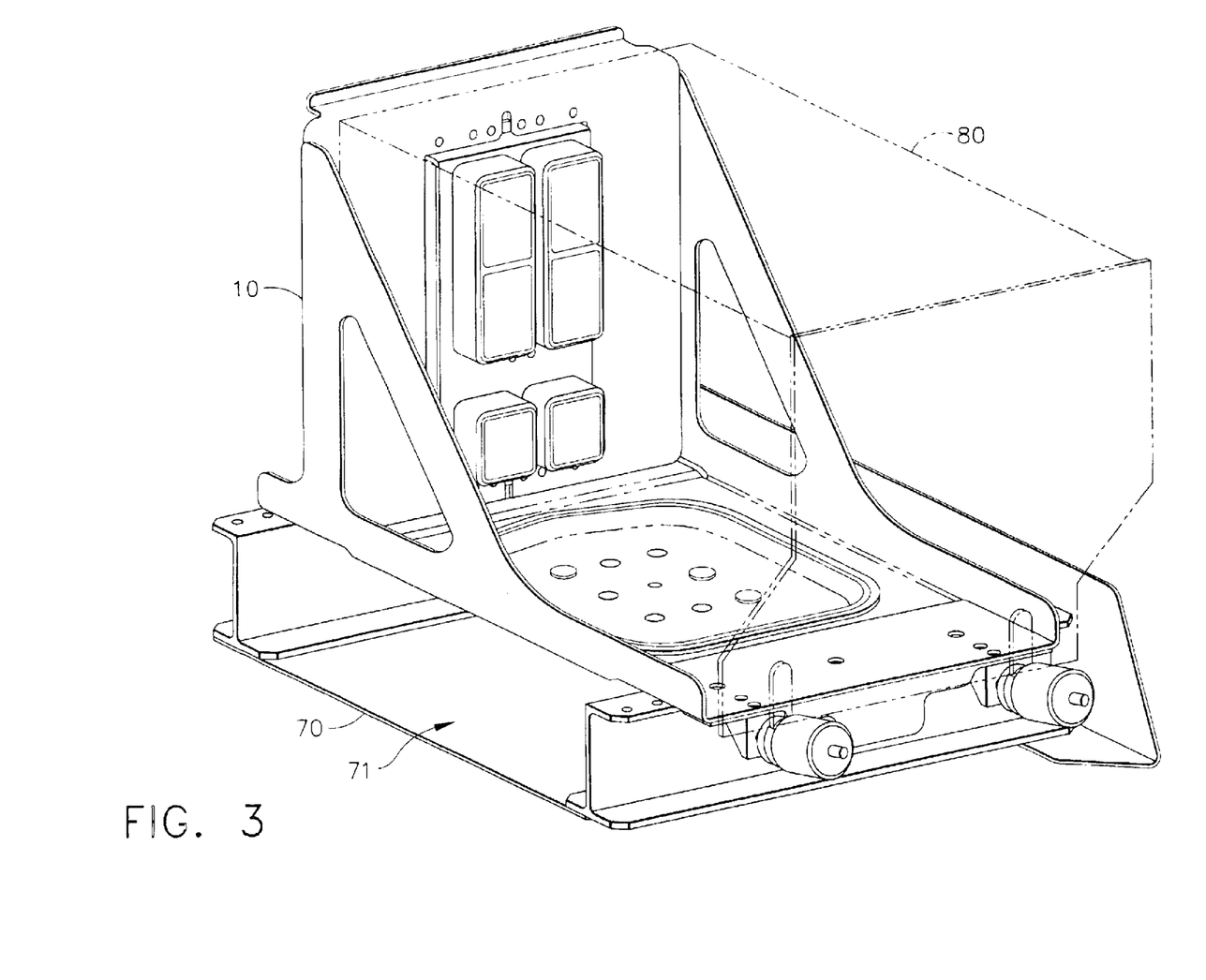
FIG. 3 is an isometric view of the tray assembly, the shelf assembly and the LRU engaged with a rack and panel connector in accordance with the present invention.
Figure 4:
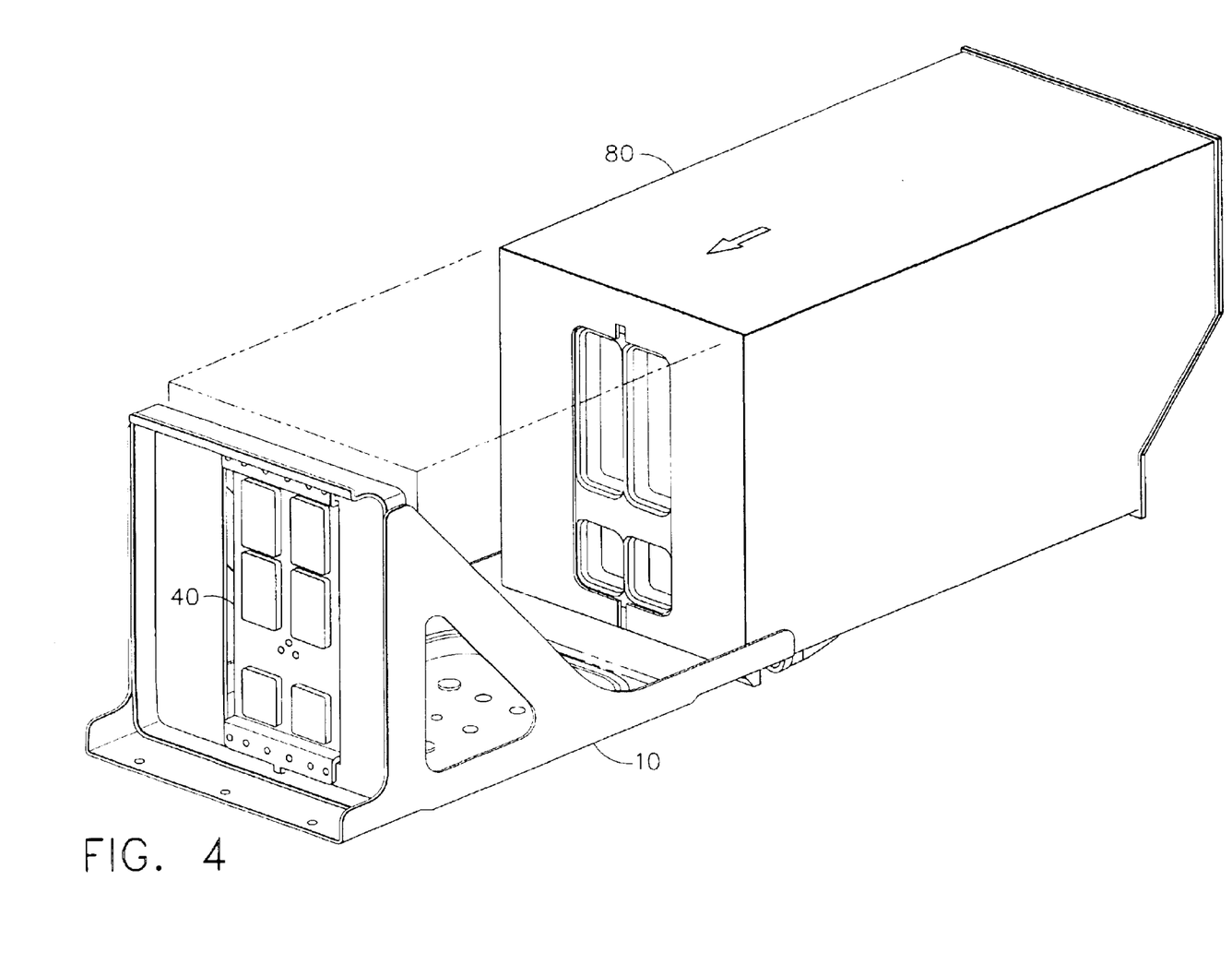
FIG. 4 is an isometric view of the tray assembly depicting the LRU prior to engagement with the rack and panel connector in accordance with the present invention.

Referring now to FIGS. 3 and 4, the LRU 80 is shown inserted and partially inserted, at various angles, into the tray assembly 10 which is further connected to the rack and panel connector 40, and secured to the shelf assembly 70 for illustrative purposes only.

Figure 5:
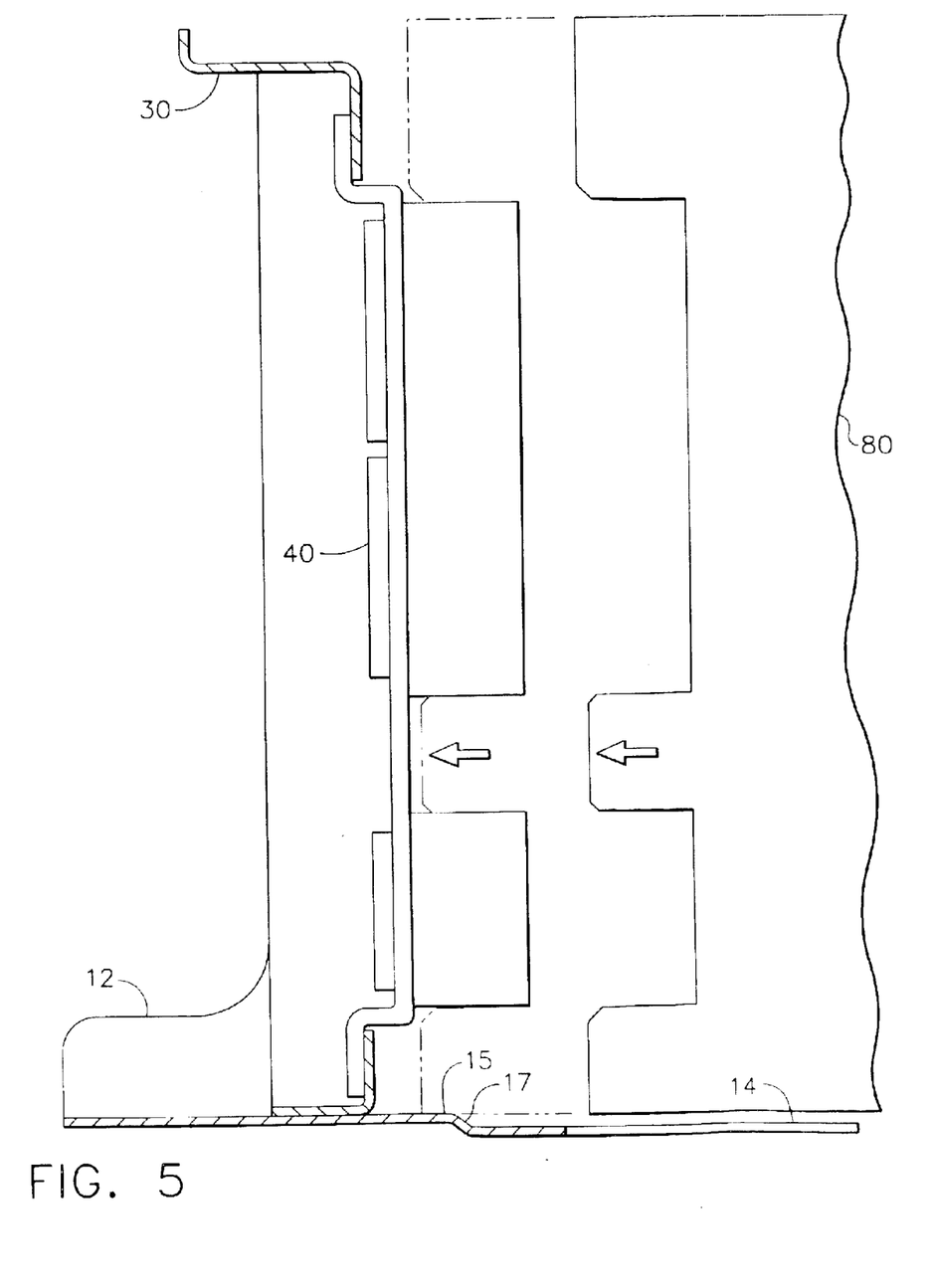
FIG. 5 is a side view showing the tray assembly, an LRU contact area, a recessed area, a transition area, and the LRU in accordance with the present invention.

Referring now to FIG. 5, the tray assembly 10 may further comprise a recessed area or depression 14 located substantially in a center of the tray assembly 10. In one embodiment, the recessed area 14 can be at a minimum depth of about 0.05 inches. The recessed area 14 may comprise an opening or cutout 12 (depicted in FIG. 6a) that can receive the seal assembly 20.

When the LRU 80 is being installed, it typically rotates around a horizontal axis, influenced by the orientation of the rack and panel connector 40. When the LRU 80 rotates, it could contact the outside horizontal surface of the avionic tray assembly 10. If such contact occurs, the force required for engaging or disengaging of the LRU 80 from the rack and panel connector 40 can increase. Since the hold-downs 50 are force-limiting devices, the amount of horizontal force applied could be inadequate to fully mate the rack and panel connector 40.

The avionic tray assembly 10 of the present invention reduces the horizontal force necessary for engagement and disengagement of the LRU 80. The avionic tray assembly 10, specifically the tray detail 11, will allow for additional rotation of the LRU for about 90% of the rack and panel connector 40 engagement. As such, contact with the tray detail 11 only occurs during the final about 10% of engagement with the rack and panel connector 40, thus significantly reducing any friction or binding between the rack and panel connector 40 and the LRU 80. Similar advantages of friction or binding reduction are also experienced during removal of the LRU 80. These advantages of the present invention are accomplished by forming the tray detail 11 with the recessed area 14 in the center of the tray detail. The recessed area 14 extends approximately the entire width of the tray detail 11 recessed to a minimum depth of about 0.05 inches to allow LRU 80 rotation.

Referring now to FIGS. 6a, 6b, 7a, and 7b, the tray detail 11 comprises a plurality of index bosses 13 that can receive a plurality of seal assembly 20 location bosses 24. A plurality of attachment tabs 25 can secure the seal assembly 20 to the tray detail 11, and the flange 26 can secure the seal assembly 20 to the horizontal surface 14 of the tray detail 11. The securing capability of the attachment tabs 25 and the flange 26 can prevent a dislodging of the seal assembly 20 from the tray detail 11 due to downward pressure during insertion or extraction of the LRU 80.

The seal assembly 20 further comprises a metering plate detail 21, a lower seal 22, and an upper seal 23. The metering plate detail 21 comprises a plurality of tabs (such as attachment tabs 25), a plurality of index or location bosses 24, and a flange 26. The lower seal 22 may be positioned on a bottom portion or surface 22a of the seal assembly 20, while the upper seal 23 may be positioned on a top portion or surface 23a of the seal assembly. The bottom surface 22a and the top surface 23a are coupled to the metering plate detail 21. The lower seal 22 which can contact or compress to the recessed area 14 of the tray detail 11, and the upper seal 23, which can contact or compress to a bottom surface of the LRU 80, enhance a seal Interface between the seal assembly 20 and the LRU 80. As such, a constant uninterrupted supply of cooling air from an air plenum 71 (depicted in FIG. 2) can be achieved.

In one embodiment, the avionics tray assembly 10 comprises the seal assembly 20 and the tray detail 11. The seal assembly 20 comprises the metering plate detail 21, a plurality of the tabs 25 disposed along the metering plate detail, a plurality of the location bosses 24 disposed along the metering plate detail and, the flange 26 extending about 0.40 inches from the metering plate detail (beyond the cutout 12). The flange 26 thus eliminates the possibility of dislodging the seal assembly 20 from the tray assembly 10. The tray detail 11 comprises the plurality of index bosses 13 and the horizontal surface 15, wherein the plurality of index bosses 13 receive the plurality of location bosses 24, wherein the plurality of tabs 25 secure the seal assembly 20 to the tray detail 11, and wherein the flange secures the seal assembly 20 to the horizontal surface 14. The seal assembly 20 secured to the tray assembly 10 is depicted in FIGS. 2–4, 6, and 7.

The tray detail 11 further comprises the internal radius 18 of about 0.07 inches that supports an area of transition between the horizontal surface 15 and the vertical surfaces 16 of the tray detail. Unlike conventional tray assemblies, the internal radius 18 is increased, thus eliminating the requirement for a dye penetrate inspection.

Figure 8:
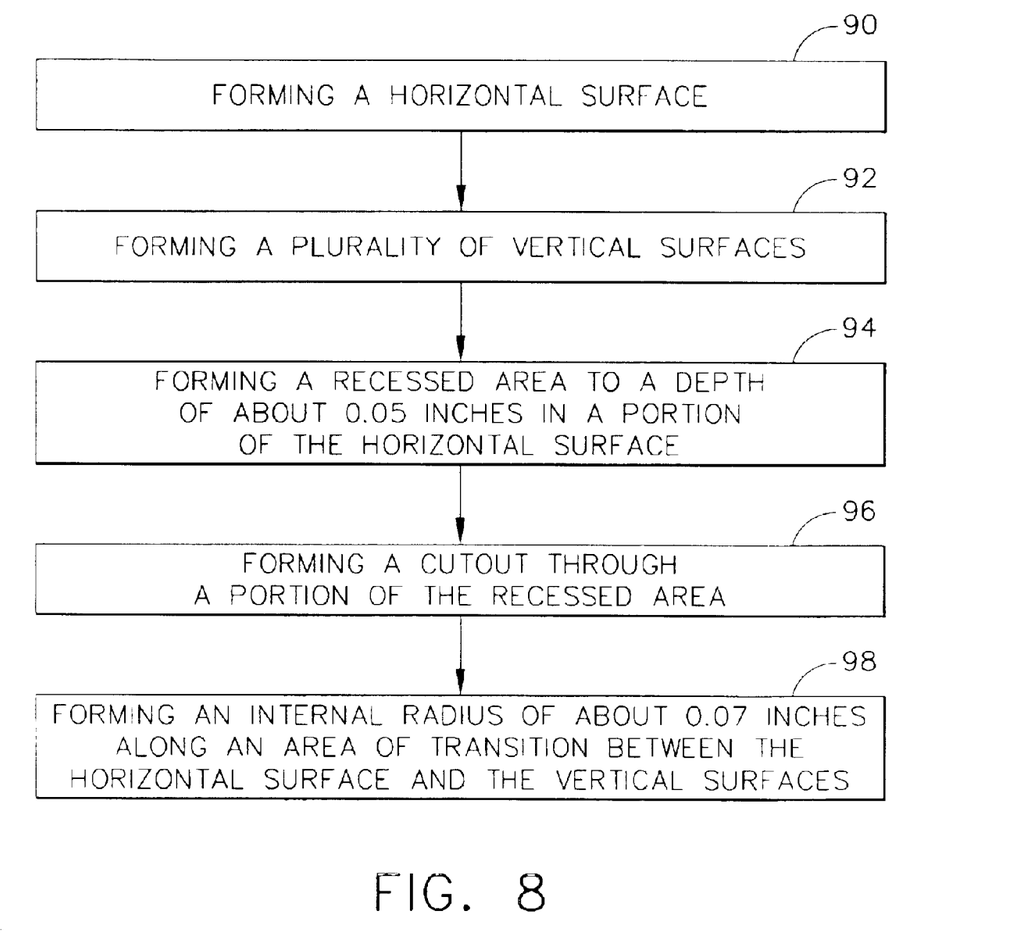
FIG. 8 is a flow chart describing a method for producing a tray assembly in accordance with the present invention.

Referring now to FIG. 8, a method for producing a tray assembly comprises forming a horizontal surface 15 at step 90 and forming a plurality of vertical surfaces 16 at step 92. The method continues with the forming of a recessed area 14 to a minimum depth of about 0.05 inches in a portion of the horizontal surface 15, and the forming of a cutout 12 through a portion of the recessed area, respectively, at steps 94 and 96. At step 98, the forming of an internal radius 18 of about 0.07 inches along a transition area between the horizontal surface 15 and the vertical surface or surfaces 16 occurs. An additional step may also include the forming of a plurality of index bosses 24 on a horizontal surface 15 of the tray assembly 10.

Figure 9:
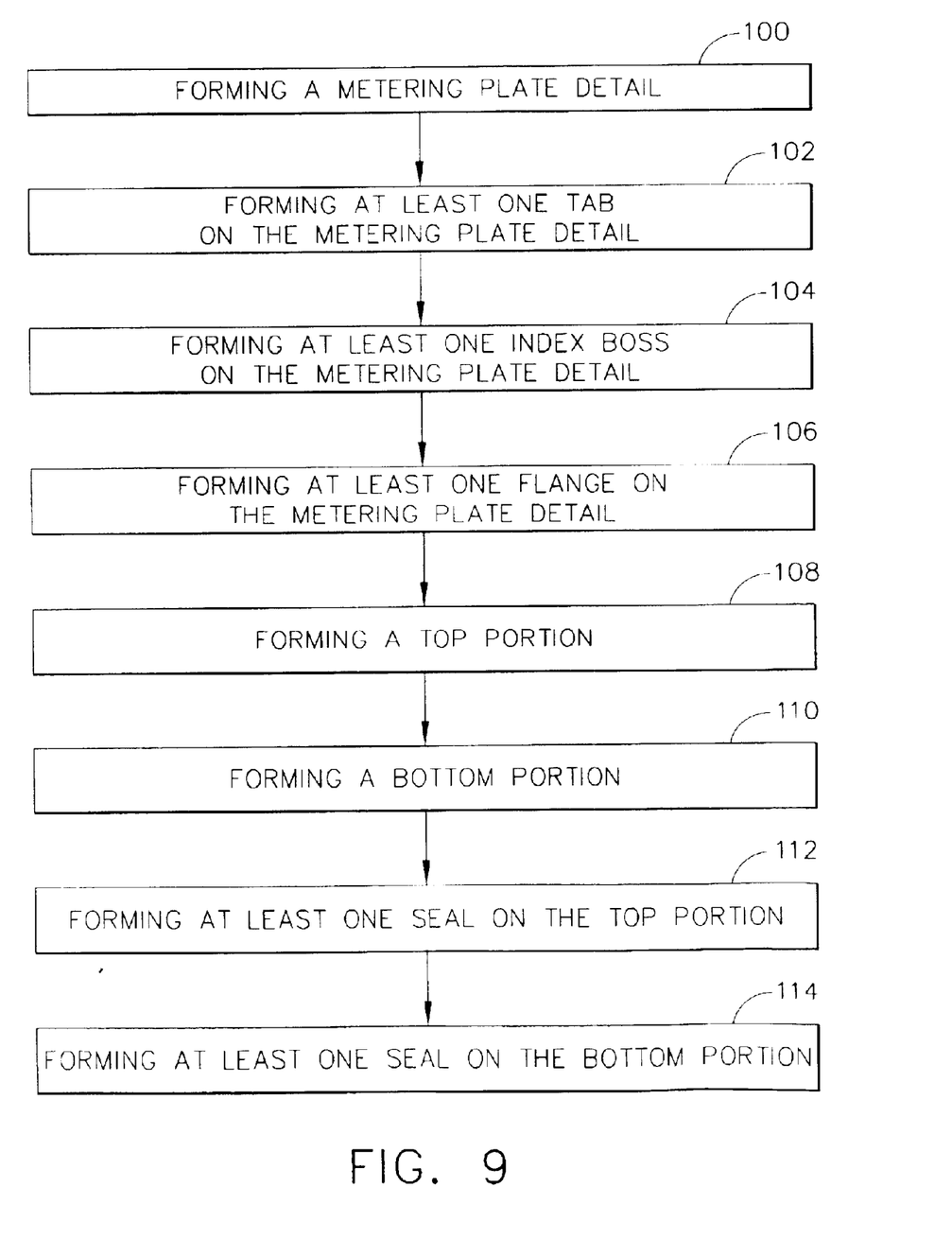
FIG. 9 is a flow chart describing a method for producing a seal assembly in accordance with the present invention.

Referring now to FIG. 9, a method for producing a seal assembly 20 comprises forming a metering plate detail 21 at step 100. Forming at least one tab 25 on the metering plate detail, and forming at least one index boss 24 on the metering plate detail occur, respectively, at steps 102 and 104. Forming at least one flange 26 on the metering plate detail occurs at step 106. The method continues with the forming of a top portion 23a, and the forming of a bottom portion 22a at steps 108 and 110, respectively. Forming at least one seal 23 on the top portion 23a occurs at step 112, and forming at least one seal 22 on the bottom portion 22a occurs at step 114.

Additional steps may also include forming at least one punch-out portion on the metering plate detail, forming at least one aperture opening on the metering plate detail, extending the flange about 0.40 inches from the metering plate detail, and extending the seal 23 above a surface of an object the seal assembly 20 may be positioned in.

As can be appreciated by those skilled in the art, the present invention provides an improved tray assembly including a plurality of index bosses and an improved metering plate including a plurality of tabs, location bosses and a flange, that overcome the misalignment, adhesion and dislodging problems associated with the prior art. If the seal assembly 20 were dislodged, it could fall into the air plenum causing extensive rework of the shelf assembly 70.

It should be understood, of course, that the foregoing relates to preferred embodiments of the invention and that modifications may be made without departing from the spirit and scope of the invention as set forth in the following claims.

We claim:

1. An avionics tray assembly, comprising:
   a seal assembly, comprising:
      a metering plate detail;
      a plurality of tabs disposed along the metering plate detail;
      a plurality of location bosses disposed along the metering plate detail; and
      a flange extending from the metering plate detail; and
   a tray detail, comprising:
      a plurality of index bosses; and
      a horizontal surface;
   wherein the plurality of index bosses receive the plurality of location bosses;
   wherein the plurality of tabs secure the seal assembly to the tray detail; and
   wherein the flange secures the seal assembly to the horizontal surface.

2. The avionics tray assembly of claim 1, wherein the tray detail further comprises a recessed area located substantially in a center of the tray detail.

3. The avionics tray assembly of claim 2, wherein the recessed area further comprises a cutout, wherein the cutout receives the seal assembly.

4. The avionics tray assembly of claim 3, wherein the flange extends about 0.40 inches beyond the cutout.

5. The avionics tray assembly of claim 3, wherein the recessed area can be sunk to a minimum depth of about 0.05 inches.

6. The avionics tray assembly of claim 1, wherein the tray detail further comprises an internal radius that supports an area of transition between the horizontal surface and a vertical surface of the tray detail.

7. The avionics tray assembly of claim 6, wherein the internal radius comprises about 0.07 inches.

8. The avionics tray assembly of claim 1, wherein the seal assembly further comprises:
   a top portion; and
   an upper seal coupled to the top portion.

9. The avionics tray assembly of claim 8, wherein the upper seal can receive a line replaceable unit.

10. The avionics tray assembly of claim 1, wherein the seal assembly further comprises:
   a bottom portion; and
   a lower seal coupled to the bottom portion.

11. The avionics tray assembly of claim 1,
   wherein the tray detail further comprises a recessed area located substantially in a center of the tray detail;
   wherein the seal assembly further comprises:
      a bottom portion; and
      a lower seal coupled to the bottom portion; and
   wherein the lower seal can receive the recessed area.

12. An avionics tray assembly, comprising:
   a seal assembly, comprising:
      a metering plate detail;
      a plurality of tabs disposed along the metering plate detail;
      a plurality of location bosses disposed along the metering plate detail;
      a flange extending from the metering plate detail;
      a top portion;
      an upper seal coupled to the top portion;
      a bottom portion; and
      a lower seal coupled to the bottom portion; and
   a tray detail, comprising:
      a plurality of index bosses;
      a horizontal surface;
      at least one vertical surface;
      a recessed area; and
      an internal radius;
   wherein the internal radius supports an area of transition between the horizontal surface and the at least one vertical surface;
   wherein the recessed area further comprises a cutout;
   wherein the cutout receives the seal assembly;
   wherein the plurality of index bosses receive the plurality of location bosses;
   wherein the plurality of tabs secure the seal assembly to the tray detail; and
   wherein the flange secures the seal assembly to the horizontal surface.

13. The avionics tray assembly of claim 12, wherein the recessed area is located substantially in a center of the tray detail and wherein the recessed area is sunk to a minimum depth of about 0.05 inches.

14. The avionics tray assembly of claim 12, wherein the upper seal receives a line replaceable unit and wherein the lower seal receives the recessed area.

15. An avionics tray assembly, comprising:
   means for indexing a seal assembly of the tray assembly to a tray detail of the tray assembly;
   means for receiving the seal assembly, wherein the means for receiving is a cutout within a recessed area of the tray detail;
   means for supporting a line replaceable unit by the seal assembly; wherein the means for indexing, the means for receiving, and the means for supporting improve an alignment and engagement of the line replaceable unit with the tray assembly; and
   wherein the means for indexing comprise a plurality of index bosses and a plurality of attachment tabs, wherein the plurality of index bosses receive a plurality of location bosses.

16. The avionics tray assembly of claim 15, wherein the means for supporting comprise a metering plate detail and a flange extending from the metering plate detail.

* * * * *